(12) United States Patent
Gagne et al.

(10) Patent No.: US 8,564,918 B2
(45) Date of Patent: Oct. 22, 2013

(54) PASS GATE OFF ISOLATION

(75) Inventors: Nickole Gagne, Saco, ME (US);
Kenneth P. Snowdon, Falmouth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 431 days.

(21) Appl. No.: 13/028,731

(22) Filed: Feb. 16, 2011

(65) Prior Publication Data

US 2012/0206845 A1    Aug. 16, 2012

(51) Int. Cl.
*H02H 3/00*    (2006.01)

(52) U.S. Cl.
USPC .......................................... 361/86; 361/91.1

(58) Field of Classification Search
USPC ............. 361/86, 91.1; 307/43; 327/1, 50, 534
See application file for complete search history.

(56) References Cited

U.S. PATENT DOCUMENTS

| 6,150,845 | A | 11/2000 | Morrill | |
|---|---|---|---|---|
| 6,163,199 | A * | 12/2000 | Miske et al. | 327/434 |
| 6,344,958 | B1 | 2/2002 | Morrill | |
| 6,538,867 | B1 * | 3/2003 | Goodell et al. | 361/91.1 |
| 6,731,486 | B2 | 5/2004 | Holt et al. | |
| 6,774,675 | B1 | 8/2004 | Miske et al. | |
| 6,847,249 | B1 * | 1/2005 | Brokaw | 327/408 |
| 8,129,862 | B2 * | 3/2012 | Audy | 307/80 |
| 8,279,568 | B2 * | 10/2012 | Stultz et al. | 361/87 |
| 2011/0255203 | A1 | 10/2011 | Stultz et al. | |

* cited by examiner

*Primary Examiner* — Rexford Barnie
*Assistant Examiner* — Christopher Clark
(74) *Attorney, Agent, or Firm* — Schwegman Lundberg Woessner P.A.

(57) ABSTRACT

This document discusses methods and apparatus for preventing or reducing sub-threshold pass gate leakage. In an example, an apparatus can include a pass gate configured to electrically couple a first node with a second node in a first state and to electrically isolate the first node from the second node in a second state, control logic configured to control the pass gate, wherein the control logic includes a supply rail, and an over-voltage circuit configured to compare voltages received at a plurality of input nodes and to couple an output to an input node a highest voltage. In an example, the output of over-voltage circuit can be selectively coupled to the supply rail.

18 Claims, 4 Drawing Sheets

PASS GATE OFF ISOLATION

BACKGROUND

In various electronic devices, pass gates, such as switches and transistor pass gates, transmit signals from one side of the pass gate to the other side of the pass gate. The pass gate can often include a control node to allow the pass gate to be turned on and off. Generally, a pass gate that is on, or enabled, provides a low impedance coupling between the sides of the pass gate. A pass gate that is off, or disabled, provides a high impedance between the sides of the pass gate. In various examples, at least one side of a pass gate can be coupled to more than one signal line. When the pass gate is disabled, leakage through the disabled pass gate can cause harmonic distortion of a signal coupled to the pass gate.

OVERVIEW

In certain examples, an apparatus can include a pass gate configured to electrically couple a first node with a second node in a first state and to electrically isolate the first node from the second node in a second state, control logic configured to control the pass gate, and an over-voltage circuit configured to compare voltages received at a plurality of input nodes and to couple an output to an input node having a highest voltage. In an example, the output of over-voltage circuit can be selectively coupled to a supply rail of the apparatus.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In various electronic devices, pass gates, such as switch pass gates and transistor pass gates, transmit signals from one side of the pass gate to the other side of the pass gate. The pass gate can often include a control node to allow the pass gate to be turned on and off. Generally, a pass gate that is in a first state, such as "on" or "enabled", provides a low impedance coupling between the sides of the pass gate. A pass gate that is in a second state, such as "off" or "disabled", provides a high impedance between the sides of the pass gate. In various examples, at least one side of a pass gate can be common to other pass gates. Off-state pass gate current leakage through one or more disabled pass gates can cause harmonic distortion of a signal coupled to an enabled pass gate.

Off-state pass gate leakage can affect a number of pass gate design specifications, such as pass gate design specifications of devices that share a connector between multiple pass gates. Such designs can be used in electronic devices where, for example, conductors of a Universal Serial Bus (USB) connector are common to multiple pass gates. In various examples, portable electronic device can have a USB connector with a conductor common to an audio pass gate, a data pass gate, and a video pass gate. In various designs, control of a first pass gate can rely on a multiple power supplies. For example, in certain devices, a first pass gate can rely on a charge pump supply coupled to a battery to transfer one type of signal and can rely on just the battery or a second charge pump supply coupled to the battery to transfer a second type of signal. In an example, when a first pass gate is disabled, a power supply, such as a charge pump supply associated with the pass gate can, also be disabled to conserve energy stored in the battery. However, signals intended to be passed by a second pass gate can be received by the first pass gate on a conductor common to both the first and second pass gate. Such signals can cause off-state leakage on the first pass gate as well as other disabled pass gates coupled to one or more conductors common to the enabled second pass gate, such as when a power supply used to control the first passgate is not "on".

Figure 1A:
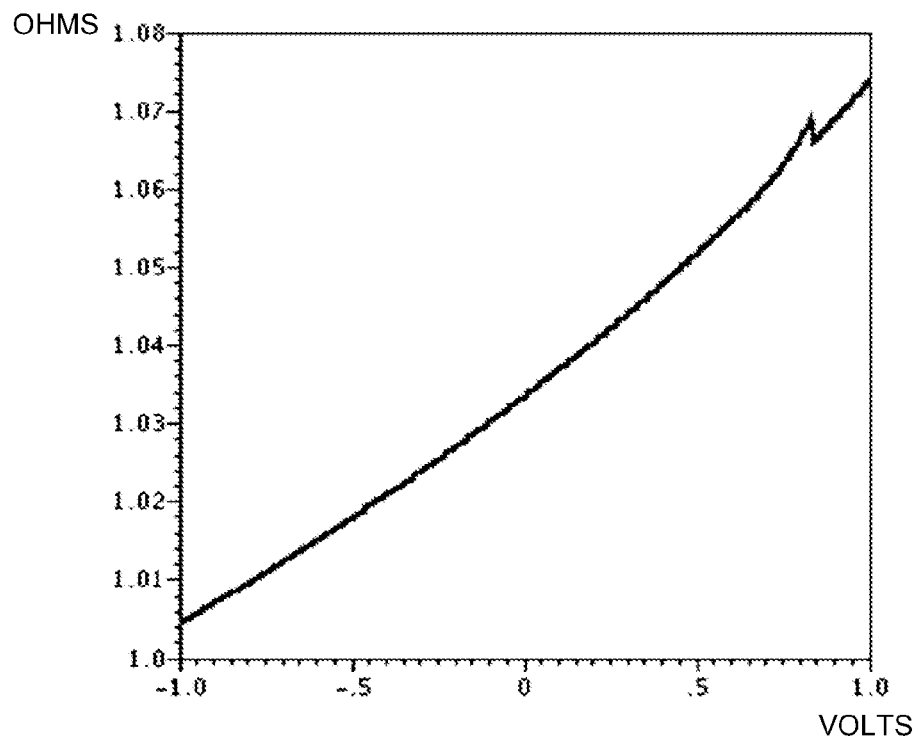
FIGS. 1A and 1B illustrate generally plots of potential off-state leakage of a pass gate.

FIG. 1A illustrates generally a plot of on-state resistance of an enabled pass gate sharing a common conductor with one or more disabled pass gates as the voltage across switched terminals of the pass gates increases from −1.0 volt to +1 volt. As the switched terminal voltage varies, control voltage of the disabled pass gates, such as a the gate voltage of a transistor pass gate, can climb so as to be biased at a sub-threshold level and one or more of the disabled pass gates can begin to leak current. For example, FIG. 1A illustrates distortion caused by off state leakage of one or more of the disabled pass gates when the received signal is at about 0.85 volts.

Figure 1B:
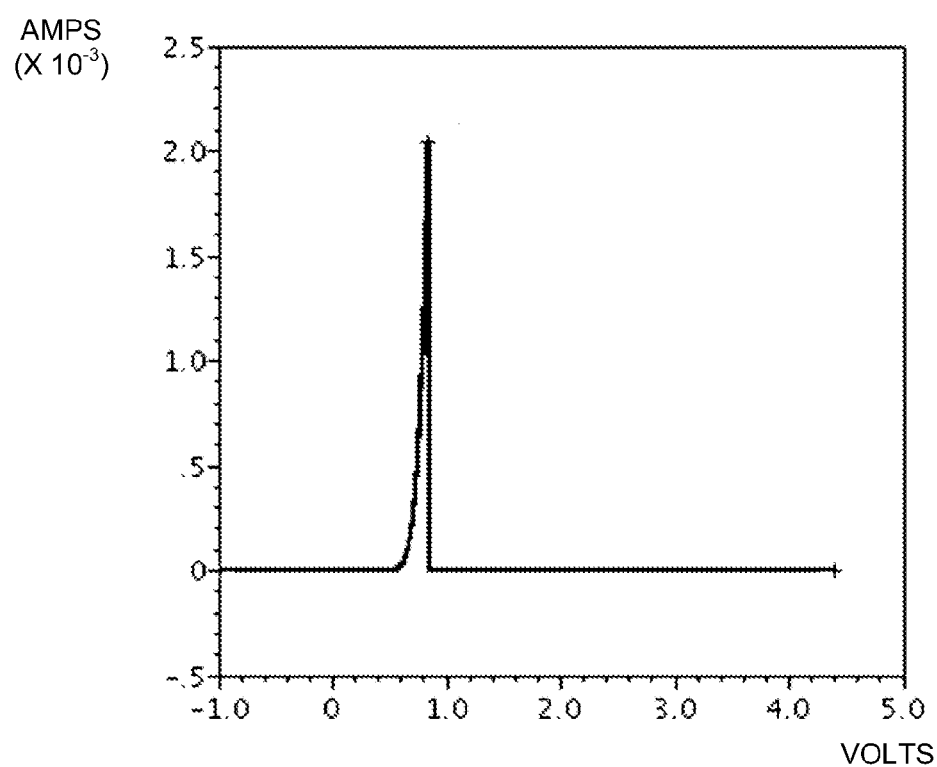

FIG. 1B illustrates generally a plot of off-state current leakage of the pass gates of FIG. 1A. In an example, when the voltage across the switched terminals of the pass gates approaches about 0.85 volts, the disabled pass gates can conduct about 2 milliamps of current. A disabled pass gate having leakage characteristics similar to those illustrated in FIGS. 1A and 1B can cause distortion, such as total harmonic distortion (THD), in a signal received on a conductor common to the disabled pass gate and an enabled pass gate. Distortion caused by disabled pass gates can reduce the performance of a device such that the device is unable to successfully receive and or transmit certain signals, even though those signals conform to an intended communication protocol except for the distortion caused by one or more disabled pass gates.

Figure 2:
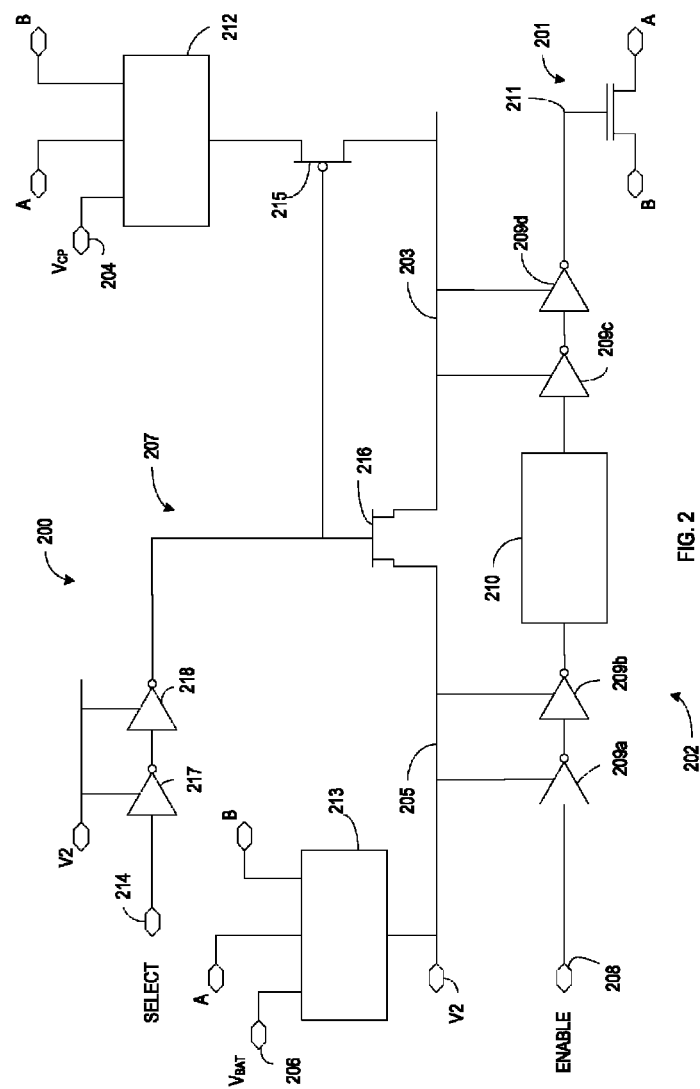
FIG. 2 illustrates generally an example of a circuit configured to reduce off-state leakage of a pass gate.

FIG. 2 illustrates generally an example of a circuit 200 configured to reduce off-state leakage of a pass gate 201, such as a transistor passgate. The circuit 200 can include a pass gate control circuit 202, a first supply rail 203 coupled to a first power supply terminal 204, a second supply rail 205 coupled to a second power supply terminal 206, and a power supply select circuit 207.

In an example, the pass gate control circuit 202 can receive a control signal at an enable input 208 and enable or disable the pass gate 201 responsive to the received control signal. In certain examples, the pass gate control circuit 202 can include a number of inverters, such as first through fourth inverters 209a-209d. The inverters can maintain isolation between components of the pass gate control circuit 202 and provide a proper logic signal level to those components. In certain examples, the pass gate control circuit 202 can include a level shift circuit 210. The level shift circuit 210 can provide a proper signal level voltage at the control node 211 of the pass gate 201, such as a gate node of an NMOS pass gate.

The level shift circuit 210 can provide a proper control signal referenced to whatever voltage level is being applied to the pass gate 201. In certain examples, the level shift circuit 210 can assure that the enable signal received at the enable input 208 of the pass gate control circuit 202 is translated to the proper signal level at the output of the level shift circuit 210. The level shift circuit 210 can avoid a situation where a PMOS transistor of the pass gate control circuit 202 can have a lower high logic gate voltage than a source voltage. As an example, third and fourth inverters 209c, 209d can include a PMOS device such as a PMOS transistor. If a high logic voltage at the gate of a PMOS transistor is greater than a threshold below the source voltage, the PMOS transistor can conduct unwanted supply current, sometimes referred to as "crowbar current." Without a level shift circuit 210, "crow bar" current can cause unintended operation of the switch circuit without reference to the signal received at the enable input 208.

Figure 3A:
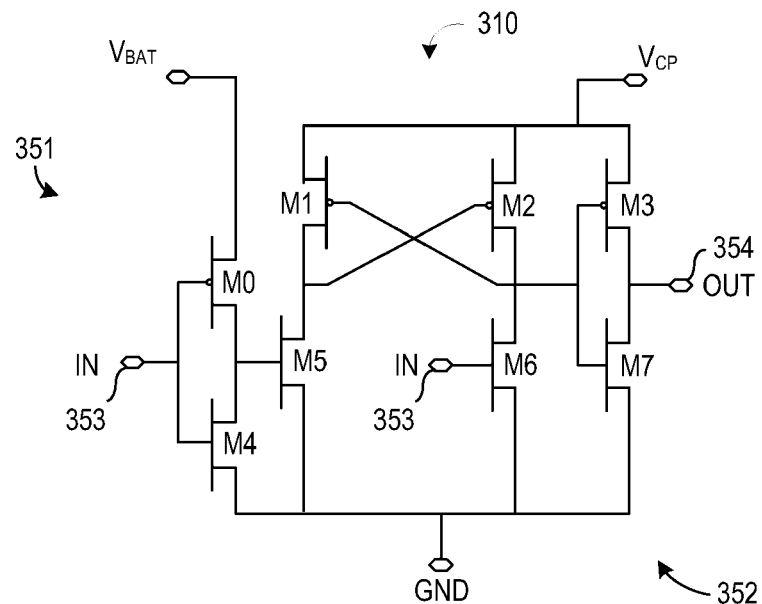
FIG. 3A illustrates generally an example of a level shift circuit.

FIG. 3A illustrates generally an example of a level shift circuit 310. The level shift circuit 310 can include an input section 351 referenced to a first supply voltage, for example $V_{BAT}$, and an output section 352 referenced to a second supply voltage, $V_{CP}$. When an input 353, such as an enable input, is at logic high with reference to GND, NMOS transistor M6 turns on. The drain of M6 is pulled to GND. M3 is turned on and an output 354 is pulled to high logic referenced to a second supply voltage, for example $V_{CP}$. Note that turning on M6 also turns on M1, preventing M2 from biasing the source of M6. When the input 353 is referenced to low logic, GND, PMOS transistor M0 of inverter pair M0/M4 turns on. The inverter turns on M5 pulling the gate of M2 low, thus, turning on M2. M2 pulls the gate of M7 of the output inverter M3/M7 high, thus pulling the output 354 to a logic low level.

Referring back to FIG. 2, the first and second power supply terminals 204, 206 can be coupled to their respective first and second supply rails 203, 205 through first and second over-voltage circuits 212, 213. In certain examples, the first and second over-voltage circuits 212, 213 can receive multiple supply voltages, such as $V_{BAT}$, $V_{CP}$, A, or B, and can provide the highest voltage of the received supply voltages to an output of the first and second over-voltage circuits 212, 213. In the illustrated example of FIG. 2, the first over-voltage circuit 212 can couple a first supply voltage to a first supply rail 203 and the second over-voltage circuit 213 can couple a second supply voltage to a second supply rail 205. In certain examples, $V_{BAT}$ can be a battery voltage of a device, $V_{CP}$ can be a second voltage, such as a charge pump voltage derived from the battery voltage, and A and B can be voltages present on the switched terminals of the pass gate 201.

Figure 3B:
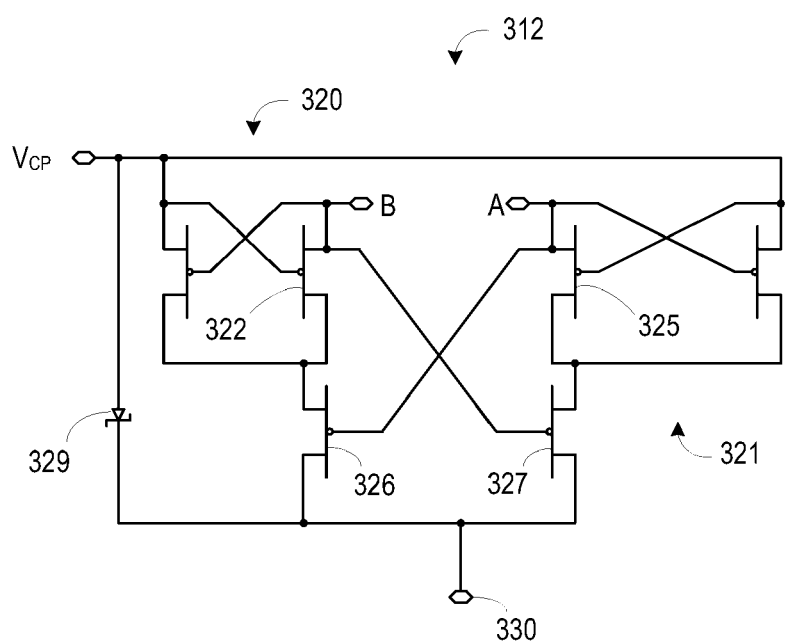
FIG. 3B illustrates generally an example of an over-voltage circuit.

FIG. 3B illustrates generally an example of a over-voltage circuit 312, such as the first over-voltage circuit 212 or the second over-voltage circuit 213 of the example illustrated in FIG. 2. The over-voltage circuit 312 can include a pair of arbiter circuits 320, 321 coupled to multiple input nodes, such as switch nodes of a pass gate (e.g., nodes A and B), and a power supply node (e.g., $V_{CP}$). Each of the first and second arbiter circuits 320, 321 can include a pair of cross-coupled transistors and a third transistor cross-coupled to an input of the other arbiter circuit. The over-voltage circuit 312 can provide, at an output 330, the highest voltage present at the input nodes (e.g., $V_{CP}$, A, or B). In an example, if $V_{CP}=0$, node B is at a low logic level voltage, and a high logic level voltage is present on node A, second and third transistors 325, 327 of the second arbiter circuit 321 will turn on raising the output 330 to about the logic level of node A. If the logic high voltage is present on node B, second and third transistors 322, 326 of the first arbiter 320 will turn on to pull the output 330 to about the logic level of node B. If the power supply is on and can provide a voltage higher than nodes A or B, the power supply voltage $V_{CP}$ can be available at the output 330 using the diode 329. In an example, the high voltage level at the output 330 can be used to power at least a portion of the circuit 200 of the example illustrated in FIG. 2. If high logic voltage levels are present on both nodes A and B, the third transistor 326, 327 of the first and second arbiter circuits 320, 321 can isolate nodes A and B from each other, and can present the higher voltage of the voltages of node A or B to the output.

Referring back to FIG. 2, the circuit 200 can use the over-voltage circuits 212, 213 to couple supply power to the first and second supply rails 203, 205. In an example, the circuit 200 can operate in a first mode with supply voltage provided from the output of the first over-voltage circuit 212 to the first supply rail 203. In such an example, when the second supply voltage, VBAT, is available at second power supply terminal 206 of the second over-voltage circuit 213, a power supply select signal can be received at the power supply select input 214 to enable the first mode. In the example illustrated in FIG. 2, a power supply select signal having a low logic level can enable the power supply select circuit 207 to enable coupling of the first over-voltage circuit 212 to the first supply rail 203 using a first select switch 215, such as a PMOS transistor, for example. In addition, a power supply select signal with a low logic level can enable the power supply select circuit 207 to isolate the first supply rail 203 from the second supply rail 205 using a second select switch 216, such as a NMOS transistor, for example, coupled between the first and second supply rails 203, 205. In the example illustrated in FIG. 2, a power supply select signal having a high logic level can enable the power supply select circuit 207 to isolate the first over-voltage circuit 212 from the first supply rail 203 using the first select switch 215, such as a PMOS transistor, for example. In addition, a power supply select signal with a high logic level can enable the power supply select circuit 207 to couple the first supply rail 203 with the second supply rail 205 using the second select switch 216, such as a NMOS transistor, for example, coupled between the first and second supply rails 203, 205.

In another mode of operation, for example, where the pass gate 201 includes a switched terminal that is common to a switched terminal of at least one other pass gate (not shown), the first over-voltage circuit 212 and power supply select circuit 207 can ensure substantially no current leakage through the pass gate 201 when the pass gate 201 is not enabled and the circuit is not receiving voltage from an external power supply, such as $V_{BAT}$ and $V_{CP}$.

In other designs, where a device includes two or more pass gates that share a switched terminal, the device can include a separate power supply to drive each pass gate, such as separate charge pumps, for example. When a pass gate is disabled, the power supply associated with that pass gate can also be disabled, or decoupled from the disabled circuitry to conserve power. However, these techniques often leave the disabled pass gate susceptible to leakage as the potential between the switched terminal of the pass gate and the control terminal of the pass gate can vary to degree that the pass gate leaks. The unwanted current leakage can impact the on-resistance, oncapacitance, total harmonic distortion, or combinations thereof of an enabled pass gate sharing a switched terminal with the disabled pass gate.

Referring again to FIG. 2, the example circuit 200 can reduce the leakage current of the pass gate during an off-state period such that a signal on a common node of a disabled pass gate is not affected by the disabled pass gate. In an example, when the supply providing a voltage, such as $V_{BAT}$, is present, at a desired voltage level, and is coupled to the second over-voltage circuit 213, the first supply rail 203 can be at a voltage potential selected by a signal received at the power supply select input 214. When the signal at the power supply select input 214 is low, the first supply rail 203 can be coupled to the first over-voltage circuit 212 using the first select switch 215. The control node 211 of the pass gate 201 can be held low when the pass gate 201 is disabled using the pass gate control circuit 202 powered, in part, by $V_{CP}$ and, in part, by $V_{BAT}$. When the signal at the power supply select input 214 is high, the first supply rail 205 can be isolated from the first over-voltage circuit 212 using the first select switch 215, the second supply rail 203 can be coupled to the first supply rail 205 using the second select switch 216, and the control node 211 of the pass gate 201 can be held low when the pass gate 201 is disabled using the pass gate control circuit 202 powered by $V_{BAT}$.

When $V_{BAT}$ is not present, the power supply select signal can be held low by external circuitry. In such a mode, the off-isolation of the pass gate 201 can be maintained using a combination of the first and second over-voltage circuits 212, 213 and the power supply select circuit 207. For example, the first and second over-voltage circuits 212, 213 can supply, at their respective outputs, the highest voltage received at their respective plurality of inputs. Consequently, as voltage on the switched terminals A, B of the pass gate 201 vary, including voltage on a switched terminal shared with another pass gate, such as an enabled pass gate (not shown), the first over-voltage circuit 212 provides a voltage at the output of the first over-voltage circuit 212. The voltage at the output of the first over-voltage circuit 212 can be the highest voltage present at one of the inputs of the first over-voltage circuit 212, such as a voltage present at the switched terminals A, B of the pass gate 201. The second over-voltage circuit 213 also receives the voltages on the pass gate terminals A, B and uses the higher of the voltages to power the second supply rail 203. The power supply select circuit 207 can include first and second inverters 217, 218, powered by the second supply rail 205, (see $V_2$). In an example, the first and second inverters 217, 218 can be designed to ensure that the first select switch 215 shorts the output of the first over-voltage circuit 212 to the first supply rail 203. Consequently, the control node 211 of the pass gate 201, using the voltage at the switch nodes A, B of the pass gate 201, is pulled to a low reference to maintain isolation between the switched nodes A, B of the pass gate 201. The control node 211 of the pass gate 201 can be pulled to a low reference even when no power is supplied to the circuit 200 from any of the power supplies coupled to circuit 200, such as the power supplies ($V_{BAT}$, $V_{CP}$) coupled to the first and second over-voltage circuits 212, 213. In an example, the second select switch 216 can be configured to only couple the second supply rail 205 to the first supply rail 203 when the second supply rail 205 has a higher voltage than the first supply rail 203 to prevent leakage from the first select switch 215. For example, if the voltage of the second supply rail 205 were lower than voltages at the switched nodes A, B of the pass gate 201, the source node of the first select switch 215 can be greater than the gate node of the first select switch 215 resulting in unwanted conduction between the switched nodes of the first select switch 215.

Figure 4A:
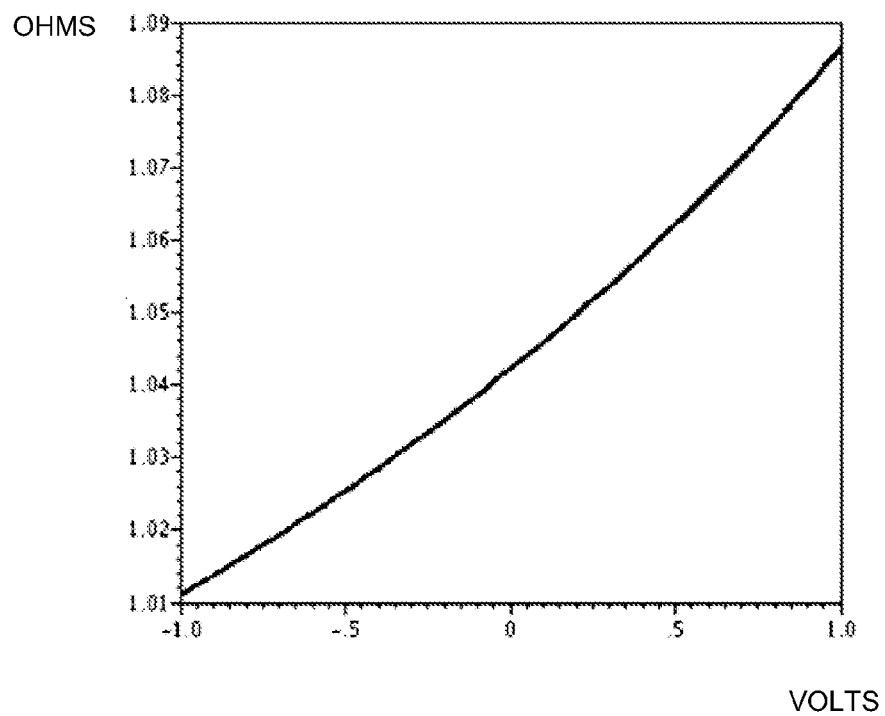
FIGS. 4A and 4B illustrate generally plots of off-state leakage of a pass gate according to an example of the present subject matter.

FIG. 4A illustrates generally a plot of on-state resistance of a pass gate sharing a common conductor with one or more disabled pass gates according to an example of the present subject matter as the voltage across switched terminals of the pass gate increases from −1.0 volt to +1 volt.

Figure 4B:
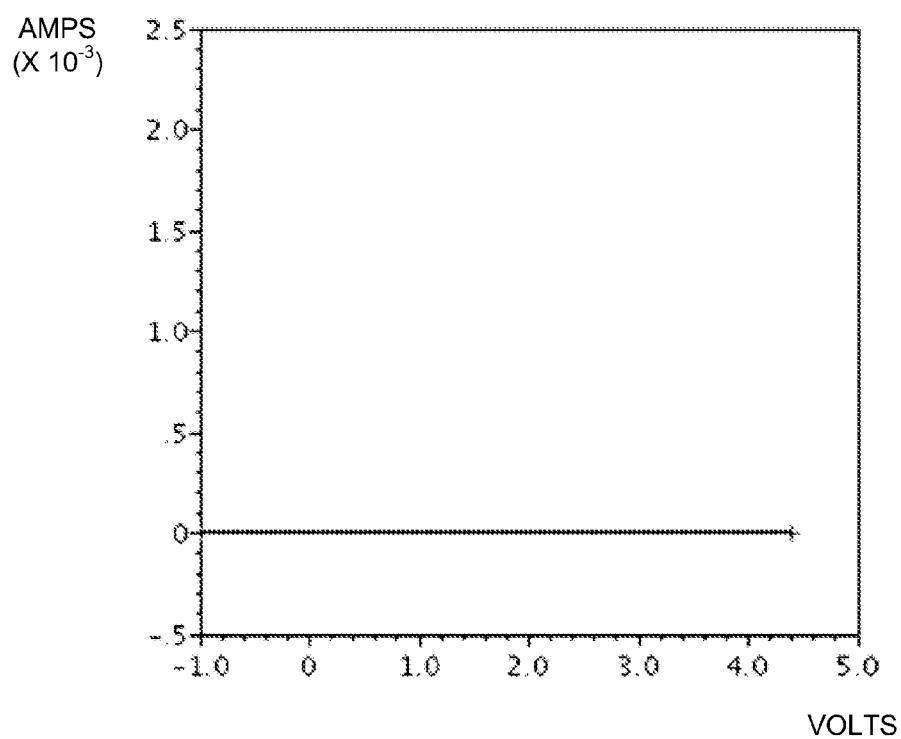

FIG. 4B illustrates generally a plot of off-state current leakage of the pass gates of FIG. 4A according to an example of the present subject matter. The combination of the two over-voltage circuits and the power supply select circuit can reduce the off-state leakage of the pass gates to little or no current. Thus, a signal received on a device having a common conductor shared between two or more pass gates can be passed through one of the pass gates without a disabled pass gate introducing off-state leakage distortion to the signal.

Additional Notes

In Example 1, an apparatus configured to prevent sub-threshold pass gate leakage can include a pass gate configured to electrically couple a first node with a second node in a first state and to electrically isolate the first node from the second node in a second state, control logic configured to control the pass gate, wherein the control logic includes a supply rail, an over-voltage circuit having a plurality of input nodes and an over-voltage circuit output, the plurality of input nodes including a first input node coupled to the first node of the pass gate, and a second input node coupled to the second node of the pass gate, the over-voltage circuit configured to compare voltages received at the plurality of input nodes and to couple the output to an input node, of the plurality of input nodes, receiving a highest voltage, and wherein the over-voltage circuit output is selectively coupled to the supply rail.

In Example 2, the apparatus of Example 1 can optionally include a switch configured to selectively couple the over-voltage circuit output to the supply rail.

In Example 3, the switch of one or more of Examples 1 and 2 is optionally configured to couple the over-voltage circuit output to the supply rail when a supply rail power supply is off.

In Example 4, the apparatus of any one or more of Examples 1-3 optionally can include a second over-voltage circuit having a plurality of input nodes and a second over-voltage circuit output, the plurality of input nodes including a first input node coupled to the first node of the pass gate, a second input node coupled to the second node of the pass gate, and a third input node coupled to the supply rail power supply, wherein the second over-voltage circuit configured to compare voltages received at the plurality of input nodes and to couple the second over-voltage circuit output to an input node, of the plurality of inputs nodes, receiving a highest voltage, and the second over-voltage circuit output can be selectively coupled to the supply rail.

In Example 5, the control logic of any one or more of Examples 1-4 can optionally include a second supply rail, and wherein the second supply rail is coupled to the second over-voltage circuit output.

In Example 6, the over-voltage circuit having the plurality of input nodes of any one or more of Examples 1-5 can optionally include a third input node configured to be coupled to a second supply rail power supply.

In Example 7, the control logic of any one or more of Examples 1-6 can optionally be configured to receive a power supply selection signal, and the supply rail of any one or more of Examples 1-6 can optionally be selectively coupled to the second supply rail using the power supply selection signal.

In Example 8, the over-voltage circuit of any one or more of Examples 1-6 can optionally be selectively coupled to the supply rail using the power supply selection signal.

In Example 9, the control logic of any one or more of Examples 1-8 can optionally be configured to receive a power supply selection signal, and the over-voltage circuit of any one or more of Examples 1-8 can optionally be selectively coupled to the supply rail using the power supply selection signal.

In Example 10, the control logic of any one or more of Examples 1-9 can optionally be configured to receive a power supply selection signal, and the control logic can optionally include a first inverter having an input and an output, a second inverter having an input and an output, the input of the second inverter coupled to the output of the first inverter, the output of the second inverter coupled to a control node of the switch. The input of the first inverter can optionally be configured to receive the power supply selection signal.

In Example 11, the apparatus of any one or more of Examples 1-10 can optionally include a second switch having a first node coupled to the first supply rail, a second node coupled to the second supply rail, and a control node coupled to the output of the second inverter, the second switch configured to selectively couple the first supply rail and the second supply rail.

In Example 12, a method configured to prevent sub-threshold pass gate leakage can include electrically coupling a first node of a pass gate with a second node of the pass gate during a first state of the pass gate, electrically isolating the first node of a pass gate and the second node of the pass gate during a second state of the pass gate, controlling the first and second state of the pass gate using control logic having a supply rail, comparing voltages received at a plurality of input nodes of an over-voltage circuit, the plurality of input nodes including a first input node coupled to the first node of the pass gate, and a second input node coupled to the second node of the pass gate, coupling an output of the over-voltage circuit to an input node, of the plurality of input nodes receiving a highest voltage, and selectively coupling the output of the over-voltage circuit to the supply rail.

In Example 13, the selectively coupling the over-voltage circuit of any one or more of Examples 1-11 can optionally include selectively coupling the output of the over-voltage circuit to the supply rail using a switch.

In Example 14, the selectively coupling the over-voltage circuit of any one or more of Examples 1-13 can optionally include selectively coupling the output of the over-voltage circuit to the supply rail using a switch when a supply rail power supply is off.

In Example 15, the method of any one or more of Examples 1-14 can optionally include comparing voltages received at a plurality of input nodes of a second over-voltage circuit, the plurality of input nodes including a first input node coupled to the first node of the pass gate, a second input node coupled to the second node of the pass gate, and a third input node coupled to the supply rail power supply, coupling an output of the second over-voltage circuit to an input node, of the plurality of input nodes, receiving a highest voltage, and selectively coupling the output of the second over-voltage circuit to the supply rail.

In Example 16, the method of any one or more of Examples 1-15 can optionally include receiving a second supply voltage at a third node of the over-voltage circuit.

In Example 17, the method of any one or more of Examples 1-16 can optionally include receiving a power supply selection signal at the control logic, In Example 17, the method can optionally include coupling a second supply rail of the control logic to the supply rail, the second supply rail coupled to the output of the second over-voltage circuit, and isolating the output of the over-voltage circuit from the supply rail, during a first state of the power supply selection signal. In Example 17 the method can optionally include coupling the output of the over-voltage circuit to the supply rail using the switch, and isolating the second supply rail from the supply rail, during a second state of the power supply signal.

In Example 18, the receiving a power supply selection signal of any one or more of Examples 1-17 can optionally includes receiving the power supply selection signal at a first inverter, providing an inverted, power supply selection signal from an output of the first inverter, receiving the inverted, power supply selection signal at a second inverter, providing a twice-inverted power supply selection signal at an output of the second inverter, and receiving the twice-inverted, power supply selection signal at a control node of the switch.

In Example 19, the selectively coupling the output of the second over-voltage circuit to the supply rail of any one or more of Examples 1-17 can optionally include selectively coupling the output of the second over-voltage circuit to the supply rail using a second switch.

In Example 20, the selectively coupling the output of the second over-voltage circuit to the supply rail using a second switch of any one or more of Examples 1-19 can optionally include receiving the twice-inverted, power supply selection signal at a control node of the second switch.

Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus configured to prevent sub-threshold pass gate leakage, the apparatus comprising:
   a pass gate configured to electrically couple a first node with a second node in a first state and to electrically isolate the first node from the second node in a second state;
   control logic configured to control the pass gate, wherein the control logic includes a first supply rail;
   a first over-voltage circuit having a plurality of input nodes and a first over-voltage circuit output, the plurality of input nodes including a first input node coupled to the first node of the pass gate, and a second input node coupled to the second node of the pass gate, the first over-voltage circuit configured to compare voltages received at the plurality of input nodes and to couple the output to an input node, of the plurality of input nodes, receiving a highest voltage; and
   a switch configured to selectively couple the first over-voltage circuit output to the first supply rail.

2. The apparatus of claim 1, wherein the switch is configured to couple the first over-voltage circuit output to the first supply rail when a first supply rail power supply is off.

3. The apparatus of claim 2, including a second over-voltage circuit having a plurality of input nodes and a second over-voltage circuit output, the plurality of input nodes including a first input node coupled to the first node of the pass gate, a second input node coupled to the second node of the pass gate, and a third input node coupled to the first supply rail power supply, wherein the second over-voltage circuit is configured to compare voltages received at the plurality of input nodes and to couple the second over-voltage circuit output to an input node, of the plurality of inputs nodes, receiving a highest voltage; and
   wherein the second over-voltage circuit output is selectively coupled to the first supply rail.

4. The apparatus of claim 3, wherein the control logic includes a second supply rail, and wherein the second supply rail is coupled to the second over-voltage circuit output.

5. The apparatus of claim 3, wherein the first over-voltage circuit having the plurality of input nodes includes a third input node configured to be coupled to a second supply rail power supply.

6. The apparatus of claim 5, wherein the control logic is configured to receive a power supply selection signal; and
   wherein the first supply rail is selectively coupled to the second supply rail using the power supply selection signal.

7. The apparatus of claim 6, wherein the first over-voltage circuit is selectively coupled to the first supply rail using the power supply selection signal.

8. The apparatus of claim 5, wherein the control logic is configured to receive a power supply selection signal; and
   wherein the first over-voltage circuit is selectively coupled to the first supply rail using the power supply selection signal.

9. The apparatus of claim 5, wherein the control logic is configured to receive a power supply selection signal; and
   wherein the control logic includes:
   a first inverter having an input and an output;
   a second inverter having an input and an output, the input of the second inverter coupled to the output of the first inverter, the output of the second inverter coupled to a control node of the switch; and
   wherein the input of the first inverter is configured to receive the power supply selection signal.

10. The apparatus of claim 9, including a second switch having a first node coupled to the first supply rail, a second node coupled to the second supply rail, and a control node coupled to the output of the second inverter, the second switch configured to selectively couple the first supply rail and the second supply rail.

11. A method configured to prevent sub-threshold pass gate leakage, the method comprising:
   electrically coupling a first node of a pass gate with a second node of the pass gate during a first state of the pass gate;
   electrically isolating the first node of a pass gate and the second node of the pass gate during a second state of the pass gate;
   controlling the first and second state of the pass gate using control logic having a first supply rail;

comparing voltages received at a plurality of input nodes of a first over-voltage circuit, the plurality of input nodes including a first input node coupled to the first node of the pass gate, and a second input node coupled to the second node of the pass gate;

coupling an output of the first over-voltage circuit to an input node, of the plurality of input nodes, receiving a highest voltage; and selectively coupling the output of the first over-voltage circuit to the supply rail using a switch.

12. The method of claim 11, wherein the selectively coupling the first over-voltage circuit includes selectively coupling the output of the first over-voltage circuit to the first supply rail using a switch when a first supply rail power supply is off.

13. The method of claim 12, including
comparing voltages received at a plurality of input nodes of a second over-voltage circuit, the plurality of input nodes including a first input node coupled to the first node of the pass gate, a second input node coupled to the second node of the pass gate, and a third input node coupled to the first supply rail power supply;

coupling an output of the second over-voltage circuit to an input node, of the plurality of input nodes, receiving a highest voltage; and selectively coupling the output of the second over-voltage circuit to the first supply rail.

14. The method of claim 13, including receiving a second supply voltage at a third node of the first over-voltage circuit.

15. The method of claim 14, including:
receiving a power supply selection signal at the control logic;
during a first state of the power supply selection signal,
coupling a second supply rail of the control logic to the first supply rail, the second supply rail coupled to the output of the second over-voltage circuit; and
isolating the output of the first over-voltage circuit from the first supply rail; and
during a second state of the power supply signal,
coupling the output of the first over-voltage circuit to the first supply rail using the switch; and
isolating the second supply rail from the first supply rail.

16. The method of claim 15, wherein the receiving a power supply selection signal includes:
receiving the power supply selection signal at a first inverter;
providing an inverted, power supply selection signal from an output of the first inverter;
receiving the inverted, power supply selection signal at a second inverter;
providing a twice-inverted power supply selection signal at an output of the second inverter; and
receiving the twice-inverted, power supply selection signal at a control node of the switch.

17. The method of claim 16, wherein the selectively coupling the output of the second over-voltage circuit to the supply rail includes selectively coupling the output of the second over-voltage circuit to the first supply rail using a second switch.

18. The method of claim 17, wherein the selectively coupling the output of the second over-voltage circuit to the first supply rail using a second switch includes receiving the twice-inverted, power supply selection signal at a control node of the second switch.

* * * * *